US007092854B2

(12) United States Patent
Gusikhin et al.

(10) Patent No.: US 7,092,854 B2
(45) Date of Patent: Aug. 15, 2006

(54) COMPUTER-IMPLEMENTED METHOD AND SYSTEM FOR DESIGNING A WORKCELL LAYOUT

(75) Inventors: Oleg Yurievitch Gusikhin, West Bloomfield, MI (US); Erica Klampfl, Canton, MI (US); Giuseppe Rossi, Dearborn, MI (US); Paul Eugene Coffman, Jr., Plymouth, MI (US); Celestine Chukwuemeka Aguwa, Farmington Hills, MI (US); Terrence Martinak, Bloomfield Hills, MI (US)

(73) Assignee: Ford Motor Company, Dearborn, MI (US)

( * ) Notice: Subject to any disclaimer, the term of this patent is extended or adjusted under 35 U.S.C. 154(b) by 708 days.

(21) Appl. No.: 10/270,969

(22) Filed: Oct. 15, 2002

(65) Prior Publication Data
US 2004/0073478 A1 Apr. 15, 2004

(51) Int. Cl.
G06F 17/50 (2006.01)
(52) U.S. Cl. .............................................. 703/1; 700/95
(58) Field of Classification Search .................... 703/1; 700/95, 100, 114, 115
See application file for complete search history.

U.S. PATENT DOCUMENTS

| 5,794,172 | A  | * | 8/1998  | Matheson et al. ........... 701/117 |
| 6,470,301 | B1 | * | 10/2002 | Barral ............................ 703/1 |
| 6,516,242 | B1 | * | 2/2003  | Brown ......................... 700/216 |
| 6,671,538 | B1 | * | 12/2003 | Ehnholm et al. ........... 600/425 |
| 2001/0051891 | A1 | | 12/2001 | Yamamoto et al. |

OTHER PUBLICATIONS

"Interactive Planning and Optimization of Workcell Layouts in an Automotive Assembly Line Environment", by Oleg Gusikhin et al, Nov. 15, 2001, pp. 1-22.

O. Gusikhin, et al.: Virtual Reality Web-Based Environment for Workcell Planning in an Automotive Assembly, ICEIS 2002. Proceedings of the Fourth International Conference on Enterprise Information Systems, ICEIS Press Setubal, Spain, vol. 1, Apr. 3, 2002.
Software Package Instructions for Measuring Office Work, Modern Office & Data Management Australia, vol. 19, No. 3, Apr. 1980.
Robert M. Wygant: Comparison of PC-Based Computerized Predetermined Time Systems, International Industrial Engineering Conference Proceedings, Proc 1990.
Donald L. Gerber, et al.: MODAPTS PLUS, A Superior System for Work Analysis, Proceedings, American Institute of Industrial Engineers, Annual Conference and Convention 1985. 1985 Inst. of Industrial Engineers.
R. Wygant, et al.: MODCAD, Computers & Industrial Engineers UK, vol. 19, No. 1-4., 1990, pp. 336-340.
Search Report, European Patent Office, Mar. 9, 2006.

* cited by examiner

*Primary Examiner*—Albert W. Paladini
(74) *Attorney, Agent, or Firm*—Brooks Kushman, P.C.; Gary A. Smith (57) ABSTRACT

Preferred embodiments include receiving input defining dimensions for a workcell and a size and location for one or more objects within the workcell, receiving input defining a walking velocity for an operator within the workcell and one or more tasks to be completed during a workcell cycle, receiving input defining one or more times and locations to complete the one or more tasks within the workcell, calculating a total walking time to complete the one or more tasks during the workcell cycle based upon the size and location of the object(s), the time(s) and location(s) to complete the task(s) and the operator walking velocity, and outputting the total walking time for the workcell cycle and a graphical representation of the workcell including the object(s) and an operator walking path between points within the workcell at which the one or more tasks are completed.

22 Claims, 6 Drawing Sheets

COMPUTER-IMPLEMENTED METHOD AND SYSTEM FOR DESIGNING A WORKCELL LAYOUT

BACKGROUND OF THE INVENTION

1. Field of the Invention

The present invention relates to a computer-implemented method and system for designing a workcell layout.

2. Background Art

Currently, workcell layout design is a cumbersome and time-consuming process. It is either performed manually with paper and pencil or with a non-interactive, two-dimensional computer interface. One disadvantage of this methodology is that every time a change is made in the sequence of workcell tasks, or any of the workcell contents are moved, the layout design typically has to be redone from scratch and completely recalculated. Another disadvantage of the conventional methodology is that it is typically only performed by a small group of plant engineers who are responsible for optimizing the efficiency of potentially hundreds of individual workcells and operators. This method is particularly inefficient because the operators themselves often know best what workcell layout(s) may increase the efficiency of their work and, consequently, the quality of the products. It should also be noted that for certain operations requiring ergonomic assessment, there exist detailed three-dimensional computer-aided design (CAD) representations of an operator workcell. However, these tools do not directly address the problem of increasing the efficiency of a workcell layout, vis-a-vis, the moving vehicles being assembled.

As a whole, the situation and methods outlined above do not satisfactorily address the problem of workcell design and planning in a moving assembly line for at least three reasons. First, when performed in this way, the planning process is cumbersome and time consuming. Second, the tools that have been used until now are static and suitable only for engineering planning: they do not support real-time line operator interaction. Third, since the process is largely manual, it is not easy for industrial engineers to uncover the layout that will produce the shortest operator walking path. In other words, inefficient choices (e.g., choices forcing the operator to needlessly spend time walking) may be made. In this regard, there are many factors that may complicate the choice of the best arrangement. Just to cite a few: for each workcell, there are several bins of parts and tools that need to be positioned; there may be external constraints (e.g., fixed obstacles, such as pillars located within the workcell); the operator moves at a speed that changes depending on the weight of the part he/she is carrying; the assembly line may be building a certain vehicle mix (e.g., two or three different vehicle models on the same line: then, at each workstation, different tasks may have to be performed depending on which vehicle is moving through).

In spite of research in the area of moving assembly line design and of line balancing, the practical application of published algorithms is limited. This is because of two main reasons. First, the published algorithms are not sufficiently flexible to model the actual conditions of assembly line workstations. Second, accurate data is difficult to obtain and maintain: often, there is no current record of a workcell layout; that is, when a workcell layout is modified the corresponding central records are not updated.

Figure 1:
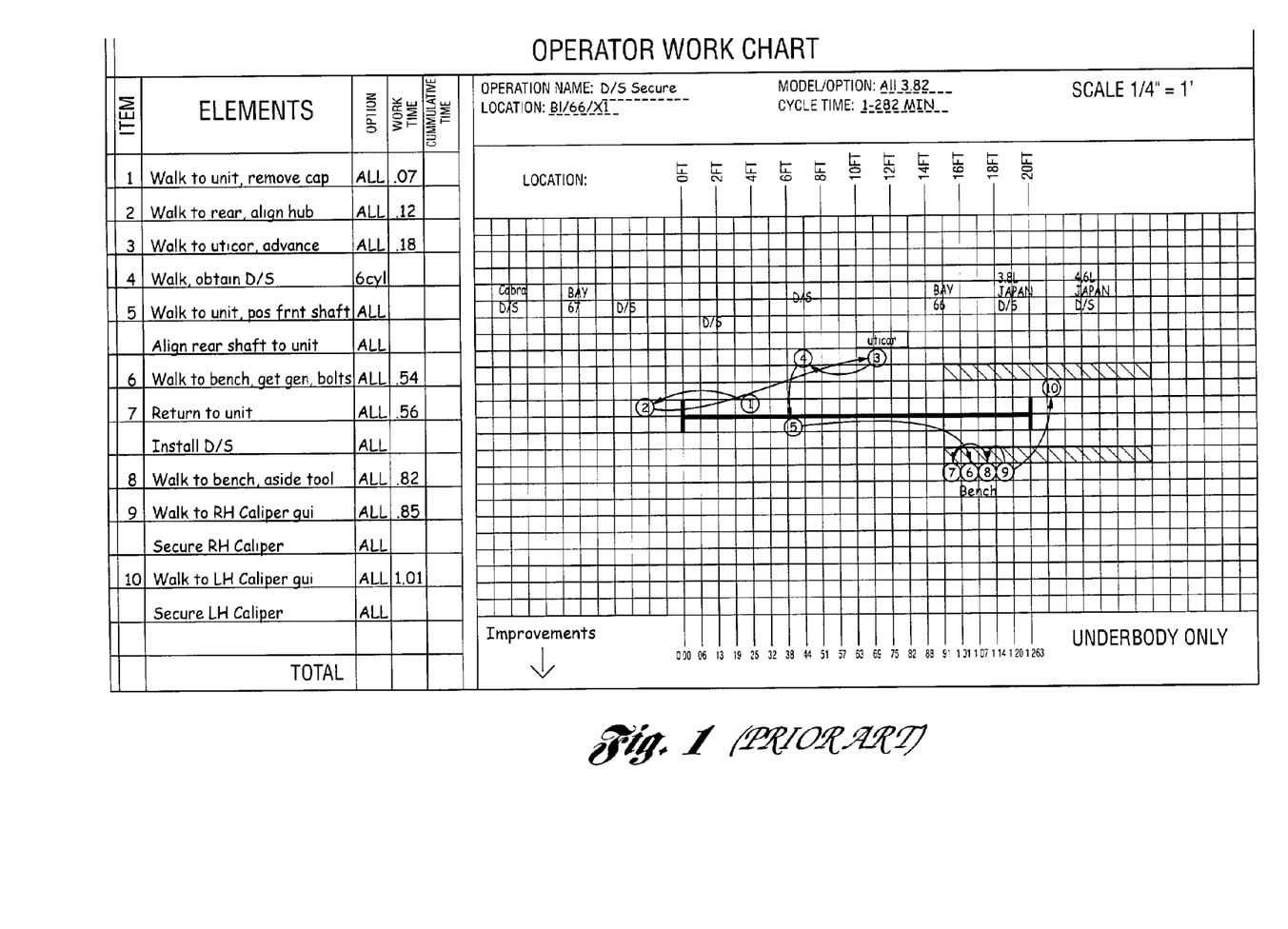
FIG. 1 illustrates a prior art "pencil-and-paper" approach for workcell layout design.

In the manual "pencil and paper approach", also known as the "wall process" (illustrated in FIG. 1), the workcell is divided into squares, and time is divided into discrete time steps. A certain number of time steps (dependent on the operator velocity) is required for the operator to move across a square. On the paper, a transparent vehicle is moved in discrete steps to determine the intersections between the moving car (on a moving assembly line) and the operator's walk path. This manual approach can be very tedious because of the large amount of manual calculations required for each path and workcell. When any of the part bins are rearranged or the line speed is changed, the calculation must be repeated to obtain the new total time. It is not surprising that this method often fails to produce an efficient workcell arrangement. The fact that the method is used for each workcell in the assembly line compounds time inefficiencies.

The two-dimensional tool approach uses an animation of the actual sequence of work elements in an operation: input information includes rack layouts, vehicle speed and configurations, task description and times (including walk times) associated with a task. Based on this input information the two dimensional computer based tool allows the user to see where an operator would perform a given task. While this approach represents an improvement over the paper and pencil method, there is no attempt to compute on the fly walking time based on the layout of the workcell, nor is there any attempt to systematically optimize workcell configuration.

SUMMARY OF THE INVENTION

One embodiment of the present invention allows users to interactively input different workcell scenarios and change the location of workcell elements in a drag-and-drop fashion while the application simultaneously outputs the associated cycle time, as well as a three-dimensional visual representation of the workcell.

One objective of the present invention is to minimize non-value added operations through a better workcell arrangement. One manner in which the present invention achieves this goal is by enabling a user to minimize operator walk time. For example, the user can rearrange the order of tasks an operator would perform or change the placement of parts and tools inside the workcell to find an arrangement that minimizes the walking time for an operator on the plant floor. Minimizing non-value added operations is also advantageous because it allows an operator to concentrate more on performing his or her task more effectively, yielding a better product.

The present invention utilizes mathematic algorithms to compute an operator's walking time and path calculations for a given cell layout, including the movement and location of workcell contents, such as part bins and tools.

Another aspect of the present invention is a virtual reality interface that generates a three-dimensional workcell scene. In one embodiment, this scene displays the path calculations made by the mathematical modeling program in the background. This aspect is advantageous because it enables a user to interactively rearrange the workcell layout in an effort to arrive at the most efficient layout.

Another advantage of the present invention is its flexibility and ease of use. This advantage allows users, such as workcell operators, to utilize the present invention with minimal or no prior training. Enabling operators themselves to utilize the present invention also takes advantage of the operators' practical knowledge and experience.

One embodiment of the present invention allows for real-time scenario planning by providing instantaneous calculations of the total time required to perform the tasks assigned to that workcell and of the total walking time. This feature allows the user to quickly evaluate a large variety of possibilities, a process that is very difficult using prior art methods.

Aspects of the present invention may be implemented on a web-based or other network platform so that aspects of the invention are not tied to any specific piece of hardware, and as a result, may be universally accessible.

Changes made by a user may be stored in a central database so that updated information is not lost. This feature allows for propagation of best part allocations and of optimal walking paths from worker to worker.

Another aspect of the present invention supports simulation of the operator walk through a VRML interface. This feature allows users to see how their work plans affect neighboring operator workcells.

The present invention may provide advice on walk path optimization with respect to given layout/process constraints by using a host of mathematical optimization methods well known to those versed in the art. This feature greatly cuts down the inefficiencies arising from prior art methods and practices.

Embodiments of the present invention include, but are not limited to, a computer-implemented method and system for designing a workcell Preferred embodiments include receiving input defining dimensions for a workcell and a size and location for one or more objects within the workcell, receiving input defining a walking velocity for an operator within the workcell and one or more tasks to be completed during a workcell cycle, receiving input defining one or more times and locations to complete one or more tasks during the workload cycle within the workcell, calculating a total walking time to complete the one or more tasks based upon the size and location of the object(s), the time(s) and location(s) to complete the task(s) and the operator walking velocity, and outputting the total walking time for the workcell cycle and a graphical representation of the workcell including the object(s) and an operator walking path between points within the workcell at which the one or more tasks are completed.

Embodiments may additionally include receiving input defining an assembly line velocity for a product being assembled wherein the total walking time calculation is additionally based upon the assembly line velocity. Object locations may be interactively defined by a user. The graphical representation of the workcell may be coded with a virtual reality mark-up language. The representation may illustrate a workcell operator or an assembly line in motion. A user may define a work zone for a product within which the workcell operator is going to complete a task. The total walking time calculation may be based additionally upon the location of the work zone. Object sizes or locations may be retrieved from a database. The objects may include parts, bins, tools, or supplies. A mathematically optimal workcell layout may be automatically generated based upon one or more optimization routines. An order for completing the tasks so as to reduce non-value-added work may be calculated and output. The tasks to be completed, the walking path and walking time may be distributed among more than one operator.

The above objects and other objects, features and advantages of the present invention are readily apparent from the following detailed description of the best mode for carrying out the invention when taken in connection with the accompanying drawings.

DETAILED DESCRIPTION OF THE PREFERRED EMBODIMENTS

The following detailed description of preferred embodiments of the present invention is described and illustrated in the context of the automotive industry. Those involved in the field of manufacturing and product assembly will recognize, however, that the innovative concepts associated with this invention may be applied to virtually any type of manufacturing or assembly.

MODAPTS

The concept of normal time is the time a qualified, experienced operator (approximately 5'-7" 145 pounds) would work at a comfortable pace, which can be maintained all day without undue stress. This is often called an "air day's work" Modular Arrangement of Predetermined Time Standards (MODAPTS) is based upon this principle. See, International MODAPTS Assoc. (1990) copyrights, Kalamazoo, Mich. and Minter, A. L. (1983) MODAPTS; Management Services, MODAPTS may be used in assembly plants in place of the old-fashioned "stopwatch study", which was a subjective way of determining on operator's efficiency rating (or speed). MODAPTS allows for ease of learning simple standards and the consistent interpretation of an operator's workload by all parties, including the operator. The operator's standard is the method and sequence in which the operator performs his/her tasks or operations.

In one embodiment of the present invention, each task in an operator's sequence is assigned a MODAPTS codes, which may be made up of two items: the type of activity and the number of MODs required to complete the activity. For example, the MODAPTS code G3 is broken into the type of activity G (to get or grasp) and the 3 MODs necessary to complete the activity. A Manufacturing Process Engineer may write an assembly process by using approximately two hundred standard language verbs. An Artificial Intelligence (AI) system may then parse the engineer's input and assign the appropriate MODAPTS code for each action. These combined actions generate an appropriate "pay" for the plant to receive for the task or option on the vehicle during its assembly.

VRML

Virtual Reality Modeling Language (VRML) is an open standard to design virtual reality worlds accessible through the world wide web (WWW). As the term virtual reality implies, VRML provides an immersive, three-dimensional environment, which provides navigation within the interaction with objects in the environment. Viewing the virtual reality world may require a VRML plug-in to a web browser. Commonly, used VRML plug-ins freely available for download include Cosmo Player:

(http://www.cai.com/cosmo), Blaxxun
(http://www.blaxxun.com), and Cortona
(http://www.parallelgraphics.com).

VRML is typically stored in a text file, which can be created with any text editor or work processor. There are also a number of specialized authoring tools in the market that may facilitate editing VRML worlds in 3D. Another approach is to automatically generate a VRML file from the application program. In the WWW environment, VRML, similar to HTML, can be generated dynamically using any sever scripting technique, such as CGI, ASP, Java Servlet. Most of the commonly used CAD or markup systems (ProE, ROBCAD, Visplus) allow exporting to a VRML file format. This provides an efficient way to incorporate already existing 3D images in the application.

The virtual reality world is described by a hierarchy of nodes, which are the main building blocks of VRML. Each node is characterized by its type and a specific set of fields associated with it. There are different types of nodes serving different functions in the virtual world. For example, the 3-D scene is described by the set of nodes representing geometrical shapes and their spatial positions. The dynamic behavior of the model is realized through the mechanism called routes, which connects the fields of a pair of nodes in such a way that the change of the field value in one node triggers changes in the other node. Using multiple routes, a single event can be propagated through the entire model, dynamically changing properties of the objects.

A special type of node called sensors initiates events in the model. Sensors are associated with events that are external to the model, such as user action or time change. For example, the user interaction with the model is typically implemented through the sensors, which react to viewer actions, such as move, click, and drag over the given shape. When the corresponding action is performed, the sensor generates an output event that can be routed to other nodes to change their properties. The animation is typically implemented using TimeSensor and Interpolator nodes. A TimeSensor node implements the clock that controls the playback of animation, while the Interpolator nodes describe the sequence of positions or orientations associated with different instances of the clock time.

Overall, VRML contains more than fifty different nodes to represent complex, 3-D graphical scenes, enhance user navigation, and implement special effects and features. In addition, when an application requires a custom behavior, VRML offers a Script node to implement domain-specific algorithms using Java, JavaScript or VrmlScript (a subset of JavaScript).

A VRML interface may be combined with a traditional 2-D layout of data and controls. In one embodiment, this can be done by combining VRML with a Java applet in the same HTML page. The Java applet can communicate with VRML through an External Authoring Interface (EAI), which allows the Java class to access and change the properties of VRML objects, as well as receive notifications of events.

VRML 2.0 can be integrated into an existing web-based client/server architecture to implement a comprehensive graphical user interface. The advantages of such an interface are especially apparent when the application domain is essentially three-dimensional.

Data of particular interest in accordance with the present invention includes the spatial and temporal relations between individual objects. In one embodiment of the present invention, the application data, which uses a predefined set of 3-D images representing specific domain objects, generates the scene "on the fly". In many cases, the object representation can be simplified or even approximated by the basic geometrical shapes, such as box, sphere and cylinder.

Calculation of Walking Time

In this section, we describe how to calculate the total time needed by the operator to complete all tasks given the position of the part bins and the sequence of tasks. Examples of tasks include walking from a given point to a bin, walking from a bin to a tool location, walking from a bin to a vehicle, picking up a part from a bin, picking up a tool, and installing a part in the vehicle. In one embodiment, the total cycle time may be calculated as the sum of the time the operator needs to walk and the time required to pick up parts, install parts, and perform other non-walking tasks. The walking time calculations may be divided into two categories: the calculation of time required to walk between two fixed points and the calculation of time required to walk between a fixed point and a point where the operator moving at a certain velocity reaches a specific point on the vehicle, which is moving at a different velocity.

Figure 2:
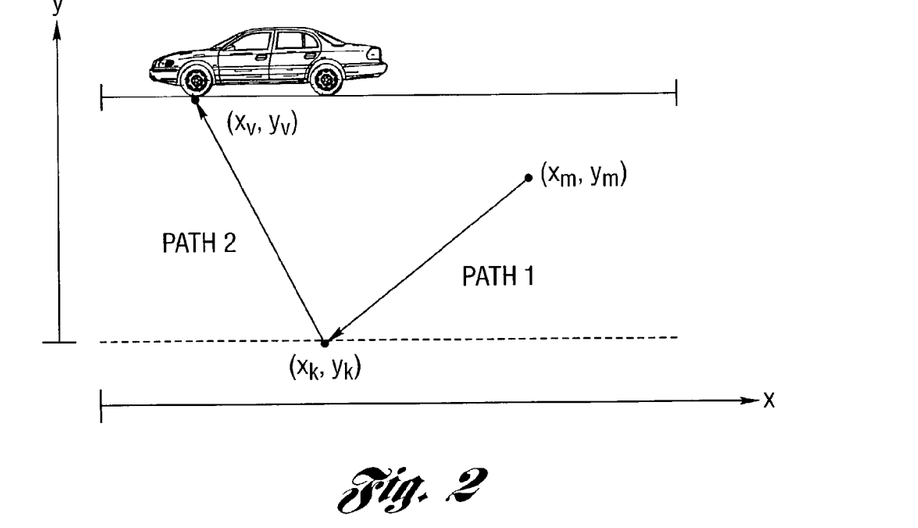
FIG. 2 illustrates a planar view of two different types of workcell walking paths. An automobile is shown in an upright position for purposes of illustration.

These two types of paths are shown in FIG. 2: Path 1 (the path between the two fixed points $(x_m, y_m)$ and $(x_k, y_k)$) belongs to the first type, and Path 2 (the path between the fixed point $(x_k, y_k)$ and the point at which the operator intersects the vehicle $(x_v, y_v)$) belongs to the second type. A fixed point can be a part bin location, a tool location, a user defined starting point, or a departure point from the vehicle, etc.

Figure 3:
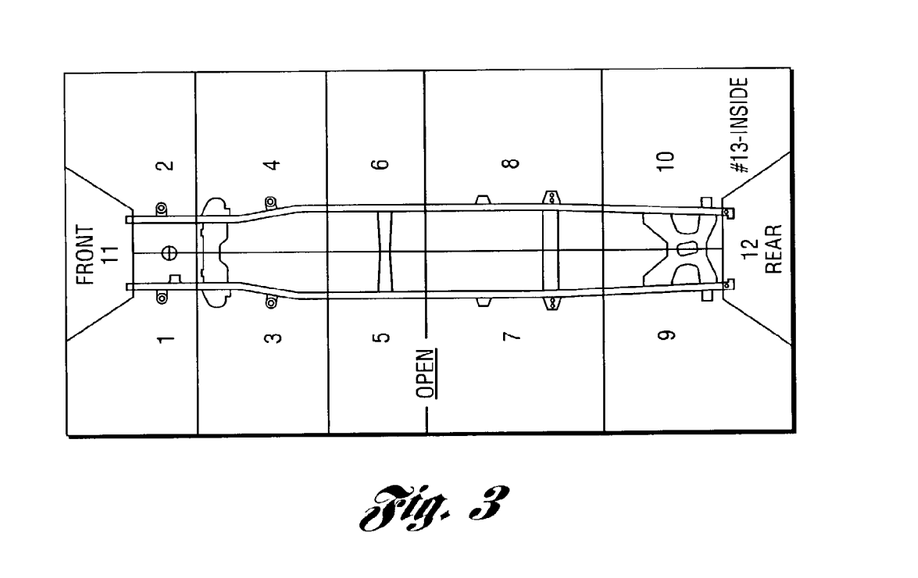
FIG. 3 illustrates a zone-by-zone schematic of a hypothetical vehicle.

When the operator approaches the vehicle to install a part, he/she is typically required to install the part in a specific location on the vehicle. A vehicle may be divided into several zones. We may approximate the install location of the part by the center point of the zone in which that install location resides. FIG. 3 is an example of a vehicle divided into thirteen zones. So, for example, if the operator was installing a rear bumper, the appropriate zone would be zone 12.

The following variables represent the preferred values that may be used in the calculations. Variables whose values may be input by a user or read from a database include:

$x_c$=the x-coordinate position of the vehicle at t=0;
$y_c$=the y-coordinate position of the vehicle at t=0;
$v_c$=the velocity of the vehicle;
$v_o$=the velocity of the operator;
$z_x(j)$=the x-coordinate for zone j;
$z_y(j)$=the y-coordinate for zone j;
$t_n$=the time to perform a specific non-walking task.

Variables whose values may be obtained in the course of the calculations include:

$t_p$=the time it takes to go between two fixed points (e.g., associated with Path 1 in FIG. 2);
$t_c$=the time it takes to go from a fixed point to the vehicle (e.g., associated with Path 2 in FIG. 2);
$t_t(k)$=the running time after the kth task of the sequence has been completed. After the last task has been completed, it is the total time associated with the sequence;

$t_T$=the running time (defined for those tasks which involve walking to the vehicle) at which the operator reaches the vehicle zone to which he/she is directed.

Recall that to cover a given distance, an object moving at a constant velocity will need a time=distance/velocity. Hence, we obtain the time that the operator needs to walk between any two fixed points $(x_m, y_m)$ and $(x_k, y_k)$ by dividing the distance between the two points by the velocity v. We call this time $t_g$, and thus, $$t_g = \frac{1}{v}\sqrt{(x_m - x_k)^2 + (y_m - y_k)^2}. \quad (1)$$

As a result, the time $t_p$ associated with Path 1 in FIG. 2 is $t_g$, where the velocity is equivalent to the velocity of the operator. So, $$t_p = \frac{1}{v_o}\sqrt{(x_m - x_k)^2 + (y_m - y_k)^2}. \quad (2)$$

Therefore, if task k involved walking between two fixed points, then the running time $t_I$ would be updated in the following way:

$$t_I(k)=t_p+t_I(k-1). \quad (3)$$

Second, we consider the time $t_c$ associated with Path 2 in FIG. 2. Recall that $t_c$ is the time that the operator needs to walk from point $(x_k, y_k)$, leaving at time $t_I$ to zone j of the vehicle. We do not know the point $x_m$ where the operator intersects the vehicle, but we do know that this point equals the distance that the vehicle will have traveled to get to this point $x_m$ plus an offset based on the initial position of the vehicle and on the location of the vehicle zone to which the operator is directed. The distance traveled by the vehicle is given by the velocity of the vehicle times the total time $t_T$ that will have elapsed by the time the operator reaches the vehicle zone to which he/she is directed. Since $t_T$ represents the total time required to reach $x_m$ (the unknown point), we can let $x_m=t_Tv_c+x_c+z_x(j)$. We can also let $y_m$ be the initial position of the vehicle in the y direction plus the y-coordinate position of the zone to which the operator is directed ($y_m=y_c+z_y(j)$). So, substituting $t_g=t_T-t_I$ and the aforementioned values of $(x_m, y_m)$ into equation 1, we get:

$$t_T - t_I = \frac{1}{v_o}\sqrt{(t_Tv_c + x_c + z_x(j) - x_k)^2 + (z_y(j) + y_c - y_k)^2}. \quad (4)$$

Since $t_T$ is in both the left and right side of equation 4, we solve equation 4 for $t_T$ and get $$t_T = \frac{v_c(a - x_k) + v_o^2 t_I + \sqrt{v_o^2(v_c t_I + a - x_k)^2 + (z_y(j) + y_c - y_k)^2(v_o^2 - v_c^2)}}{v_o^2 - v_c^2}. \quad (5)$$

(For notation simplification, we let $a=x_c+z_x(j)$).

Therefore, the time $t_C$ associated with Path 2 is:

$$t_c=t_T-T_I. \quad (6)$$

Therefore, if task k involved walking from a fixed point to the moving vehicle, then the running time $t_I$ would be updated in the following way:

$$t_I(k)=t_c+t_I(k-1)=t_T. \quad (7)$$

Figure 4:
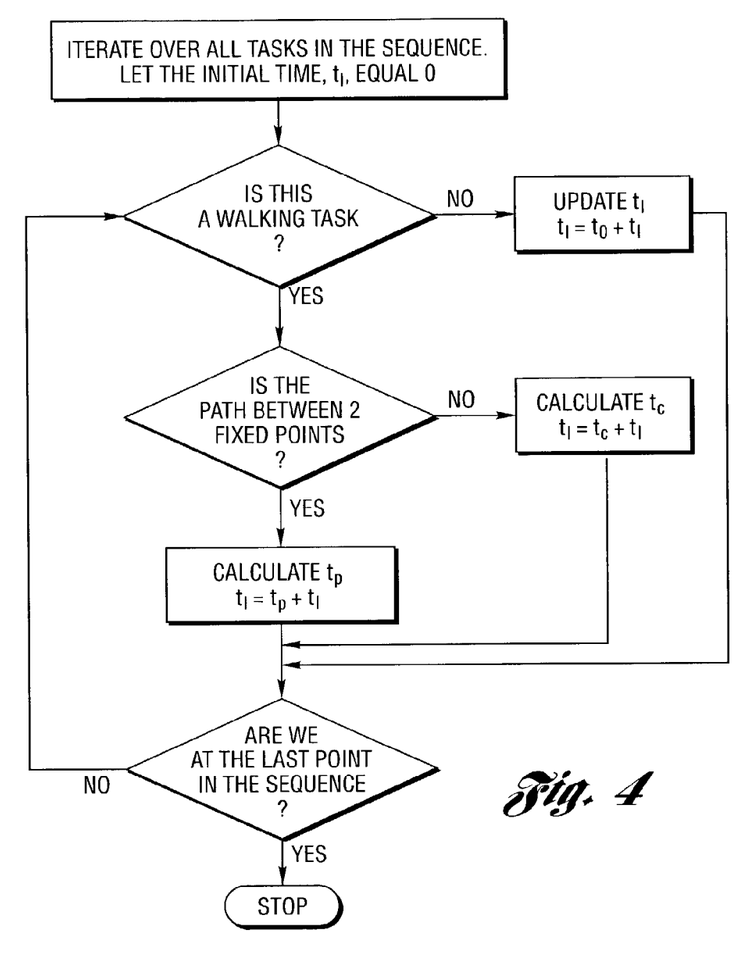
FIG. 4 illustrates a preferred methodology for calculating the time necessary to perform certain workcell tasks for a given workcell layout.

The flowchart in FIG. 4 describes a preferred method for calculating the entire time necessary to perform all tasks in a given sequence and for a given cell layout. We iterate over all tasks in a prescribed sequence, calculating the time the operator needs to walk between locations where the known walking tasks must be performed. In this embodiment, two types of path calculations are used:

1. Calculation of the time between two fixed locations ($t_p$ represents this time).
2. Calculation of the time between a fixed location and a location where the operator intersects the moving vehicle ($t_c$ represents this time). At this intersection, the operator will usually begin a part installation or read instructions from the vehicle. The operator and the vehicle will likely move at different velocities.

We may also keep track of the running time, which is the time required to perform the sequence of all tasks up to and including the current one.

Algorithm for Calculating Total Cycle Time

Figure 8:
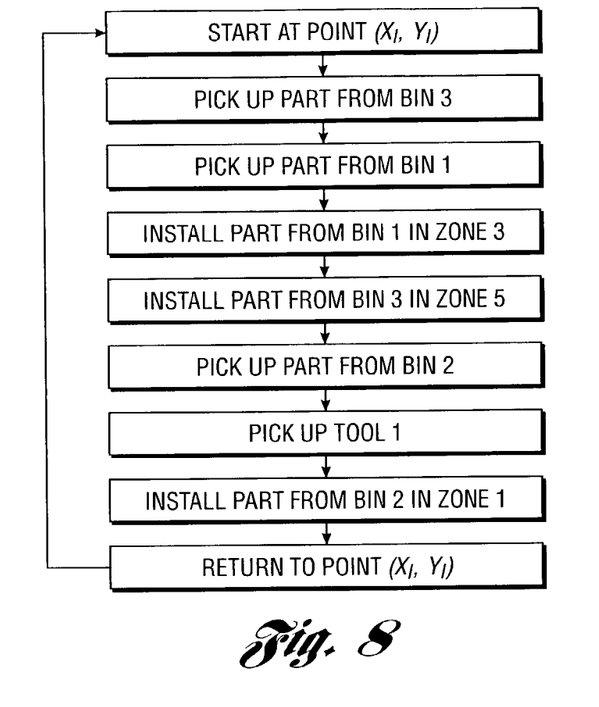
FIGS. 8 and 9 illustrate example workcell workflow sequences.
Figure 9:
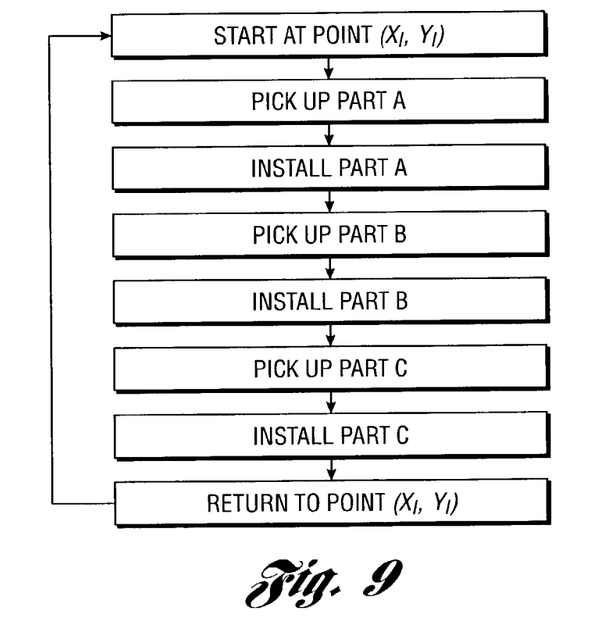

For a given sequence of operations to be performed in the workcell, the total cycle time can be calculated by determining whether the path associated to each operation that involves walking is between two fixed points (Path 1 in FIG. 2) or between a fixed point and a point on the moving vehicle (Path 2 in FIG. 2). Then for each operation in the sequence one determines the time at which that operation ends (running time): for operations that involve walking formula (2) is used for paths between two fixed points, formulas (5) and (6) are used for paths between a fixed point and a point on the moving vehicle. The total cycle time for a given sequence of operations is equal to the running time at the end of the sequence. FIGS. 8 and 9 show simple examples of sequences of operations for a given workcell.

Optimization of Part Bin Locations

In this section we describe a preferred methodology for minimizing an operator's walking time, which is considered non-value added time. This reduction in walking time can be accomplished in one embodiment by changing the sequence of tasks and/or rearranging the location of the part bins. Here, we address only the problem of determining where to place the part bin locations in order to reduce the operator's walking time.

Figure 5:
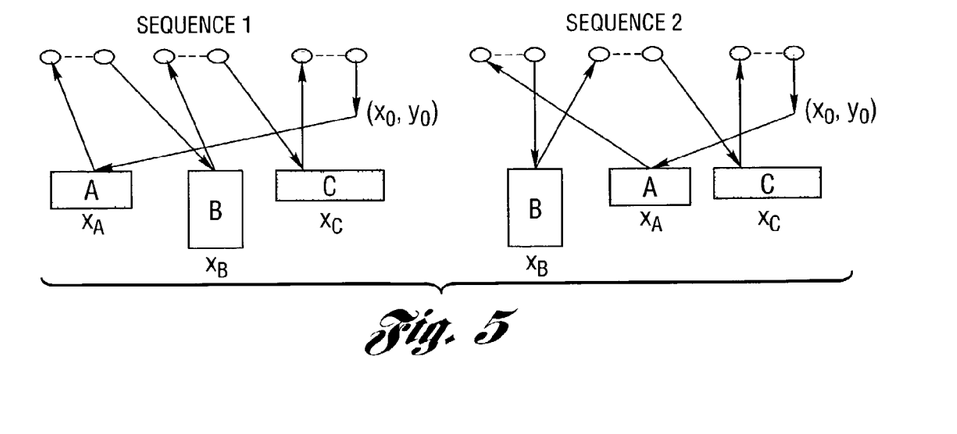
FIG. 5 illustrates two possible walking paths for the hypothetical workcell workflow sequence illustrated in FIG. 9.

Consider the simple example sequence illustrated in FIG. 9. Given this sequence, there are infinite ways to arrange or position the part bins that will give different walking times. FIG. 5 shows two possible paths associated with the sequence, and of course, there are many more.

Below we consider three example formulations of the optimization problem of minimizing walking time. The first formulation minimizes the walking time without ensuring that the part bins are completely contained in the workcell and do not overlap. The second formulation assumes that the part bins are in a line in the x-direction, they do not overlap in the x-direction, and the are completely contained in the workcell. The third formulation assumes that the part bins can be anywhere in the workcell as long as they are completely contained in the workcell, but if they overlap in the y-direction, then they cannot overlap in the x-direction and vice versa. In all three formulations, the objective function is to minimize the total cycle time, which is the time it takes an operator to complete all tasks. Recall that at the end of the path time calculation, $t_f$ is the total path time and is a function of all of the x-coordinates representing the center point of the different part bin locations and also a function of all of similar y-coordinates for the third formulation.

The first formulation is an unconstrained nonlinear programming problem (NLP) that minimizes the operator's path time. We assume that all of the boxes are in a horizontal line (that is, we only find the optimal x-coordinates), but we do not guarantee that the bins fall completely within the cell or that they do not overlap. The number of part bins is denoted by n; the output decision variables are the x-coordinates that represent the center point of the part bins. The following unconstrained NLP has n variables:

$$\min_{x_i \forall i} t_f(x_1, \ldots, x_n) \tag{8}$$

One methodology for solving this problem includes using the downhill simplex method in multi-dimensions.

The second formulation yields a constrained NLP that minimizes the operator's path time, while guaranteeing that the part bins do not overlap in the x-direction and are completely contained in the workcell. In this formulation, $L_1$ is the length of the part bins in the x-direction, $L_x$ is the length of the workcell in the x-direction, and $x_1$ are the decision variables that yield the x-coordinate positions for the center of the part bins. This NLP, $$\min_{x_i \forall i} t_f(x_1, \ldots, x_n)$$

subject to $$(x_i - 0.5L_i - (x_j + 0.5L_j))(x_j - 0.5L_j - (x_i + 0.5L_i)) \leq 0 \tag{99}$$

bounds $$0.5L_i \leq x_i \leq L_x - 0.5L_i \text{ for } i=1, \ldots, n, \tag{10}$$

has n variables and $$\frac{n(n-1)}{2}$$

constraints. We solve this problem using NLP solvers well known to those versed in the art.

The third problem formulation makes sure that if the part bins overlap in the x direction, then they do not overlap in the y direction and vice versa. If the z direction is relevant, i.e., if part bins are allowed to be stacked on top of one another, this formulation can still be used. Furthermore, the formulation guarantees that the bins are a specified distance away from the assembly line; we refer to this distance as $\lambda$, where $0 \# \lambda \# \max_i LBY_i$ and $LBY_1$ is the length of bin i in the y-direction. Other input variables are $LBX_i$, the length of bin i in the x-direction; n, the number of bins; $L_x$, the length of the workcell in the x-direction; and $L_y$, the length of the workcell in the y-direction. The x and y decision variables are continuous variables that represent the x and y coordinates of the center of the part bins. The p and q decision variables are binary variables used to guarantee that the bins can overlap in at most one direction. This can be formulated as a nonlinear mixed integer programming problem (MINLP) with $n^2+n$ variables and $$\frac{n(n-1)[n(n-1)+1]}{2}$$

constraints. Constraint 5 determines whether or not the bins overlap in the x-direction. If they do not overlap, then the equation can be satisfied with p=1 or p=0. However, the bins do overlap, then the equation is only satisfied with p=0. Constraint 6 is similar, but for the y-direction. Constraint 7 guarantees that the bins do not overlap in at least one direction because p+q must be at least one. The MINLP formulation is:

$$\min_{x_i, y_i, \forall i} t_f(x_1, \ldots, x_n, y_1, \ldots, y_n) \tag{11}$$

subject to $$(x_i - .5LBX_i - (x_j + .5LBX_j))(x_j - .5LBX_j - (x_i + .5LBX_i))p_k \leq 0 \tag{12}$$

$$\text{for } i = 1, \ldots, n \quad j = i+1, \ldots, n \quad k = 1, \ldots, \frac{n(n-1)}{2}$$

$$(y_i - .5LBY_i - (y_j - .5LBY_j))(y_j - .5LBY_j - (y_i + .5LBY_i))q_k \leq 0 \tag{13}$$

$$\text{for } i = 1, \ldots, n \quad j = i+1, \ldots, n \quad k = 1, \ldots, \frac{n(n-1)}{2}$$

$$p_k + q_k \geq 1 \text{ for } k = 1, \ldots, \frac{n(n-1)}{2} \tag{14}$$

bounds $$.5LBX_i \leq x_i \leq L_x - .5LBX_i \text{ for } i = 1, \ldots, n \tag{15}$$

$$.5LBY_i \leq y_i \leq L_y - \lambda - .5LBY_i \text{ for } i = 1, \ldots, n$$

$$p_k, q_k \in \{0, 1\} \text{ for } k = 1, \ldots, \frac{n(n-1)}{2}.$$

System Architecture and Functionality

Figure 6:
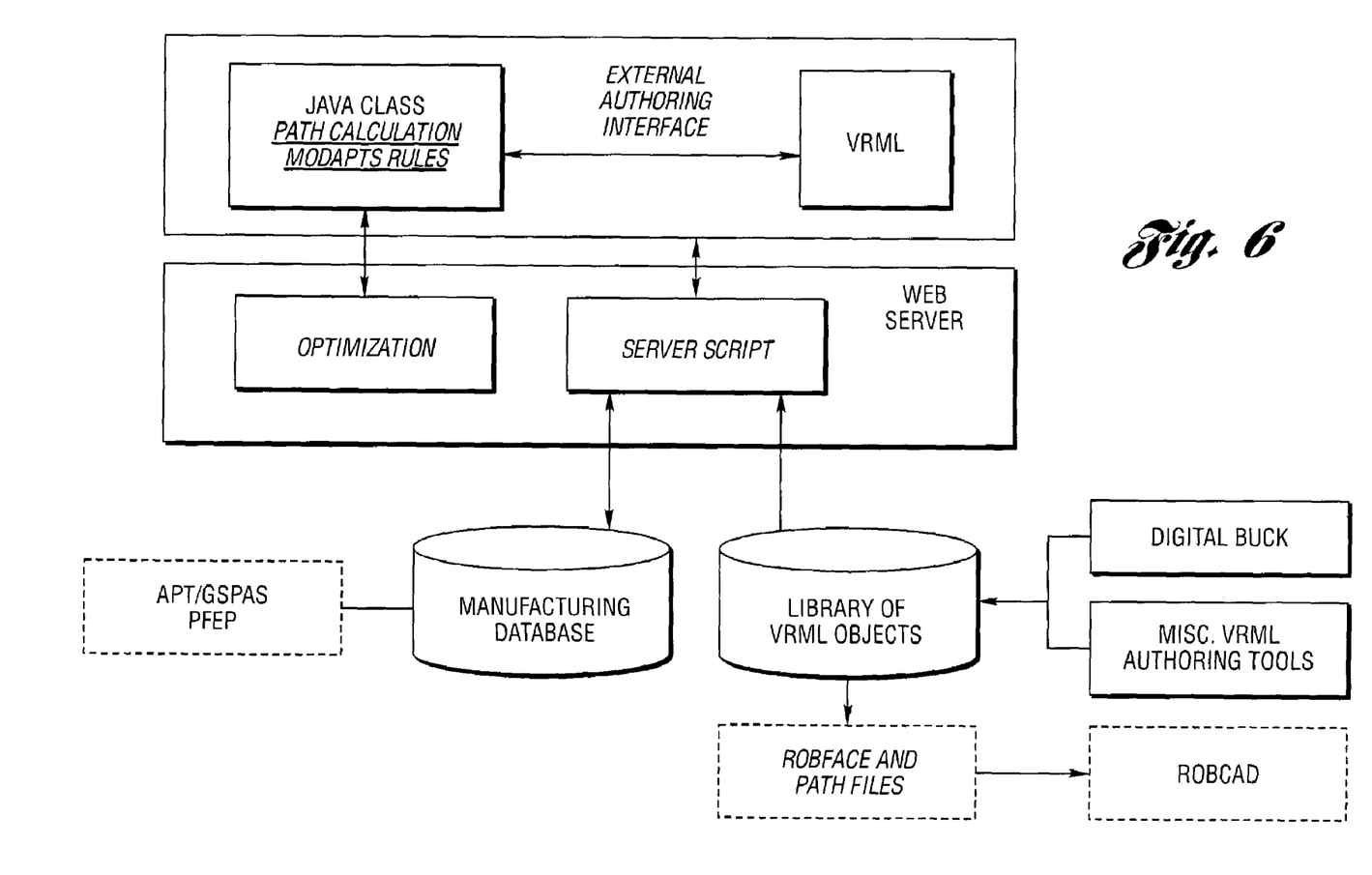
FIG. 6 is a block diagram illustrating a preferred system implementation of the present invention.

This section describes a preferred system architecture and various functionality of the workcell layout tool. FIG. 6 exhibits the preferred system architecture for the present invention. The architecture is that of a typical Web client/server system. In accordance with the preferred embodiment, the server script dynamically generates a VRML scene, such as the example VRML screen illustrated in FIG. 7, from a set of predefined three-dimensional objects using information about their spatial and temporal relations. This information may be input by a user or retrieved from a database.

VRML approximates most of the objects, using basic geometrical shapes, such as boxes. However, in some instances it is desirable to use an image that is close to the actual object in order to improve the conceptual understanding of the scene. For example, substituting a geometric shape with a three-dimensional image of the actual vehicle being assembled may help to improve the accuracy of the study. Fortunately, most three-dimensional vehicle images can be easily accessed and exported/imported to VRML. When the scene is loaded to the client VRML browser, the operator path is calculated according to algorithm described above and superimposed on the workcell image (see FIG. 7). This algorithm may be implemented in a Java class. The user can then interactively rearrange the locations of the part bins, tools, initial vehicle, and operator locations by clicking and dragging corresponding objects in the VRML scene.

VRML generates an event with drag, which triggers recalculation of the operator walk path simultaneously with its visual adjustment. This allows for "what if" analysis to be accomplished in a very rapid manner compared to the manual paper and pencil method. By default, the user can drag the object along a plane, which is the most often used function in the workcell planning what-if analysis. However, when required, the user may switch this default behavior associated with the drag action to movement in the vertical direction or rotation of the object (this vertical movement represents part bins that may be located on a shelf or parts arriving on a conveyor belt, etc.). In addition, the user can analyze how the speed of the line affects an operator's walking time (workload) by increasing or decreasing the line speed. Furthermore, an operator can use an "advice" button that suggests an arrangement of parts based on the optimization routines discussed above.

The system also provides the capability to simulate the assembly operation. This capability is implemented using the VRML animation technique. Simulation allows the user to study the details of an operator's moves, according to MODAPTS rules, within the workcell synchronized with the move of the unit. This feature is very useful for validating the input data and feasibility of the given workcell arrangement, especially for complex operator paths. It can also be used to see how the design of a given workcell affects neighboring workcells.

When satisfied with the developed workcell arrangements, the user can save the results back into a database. This may be done through a Java class, which queries VRML to obtain current locations of the cell objects and updates the database. Information maintained in the database could be used for future workcell planning, analysis and improvement. Note that the interface is a three-dimensional visualization tool. Hence, several views can be obtained and printed, including the two-dimensional for a markup study or to be posted on the wall for the operator's use.

Figure 7:
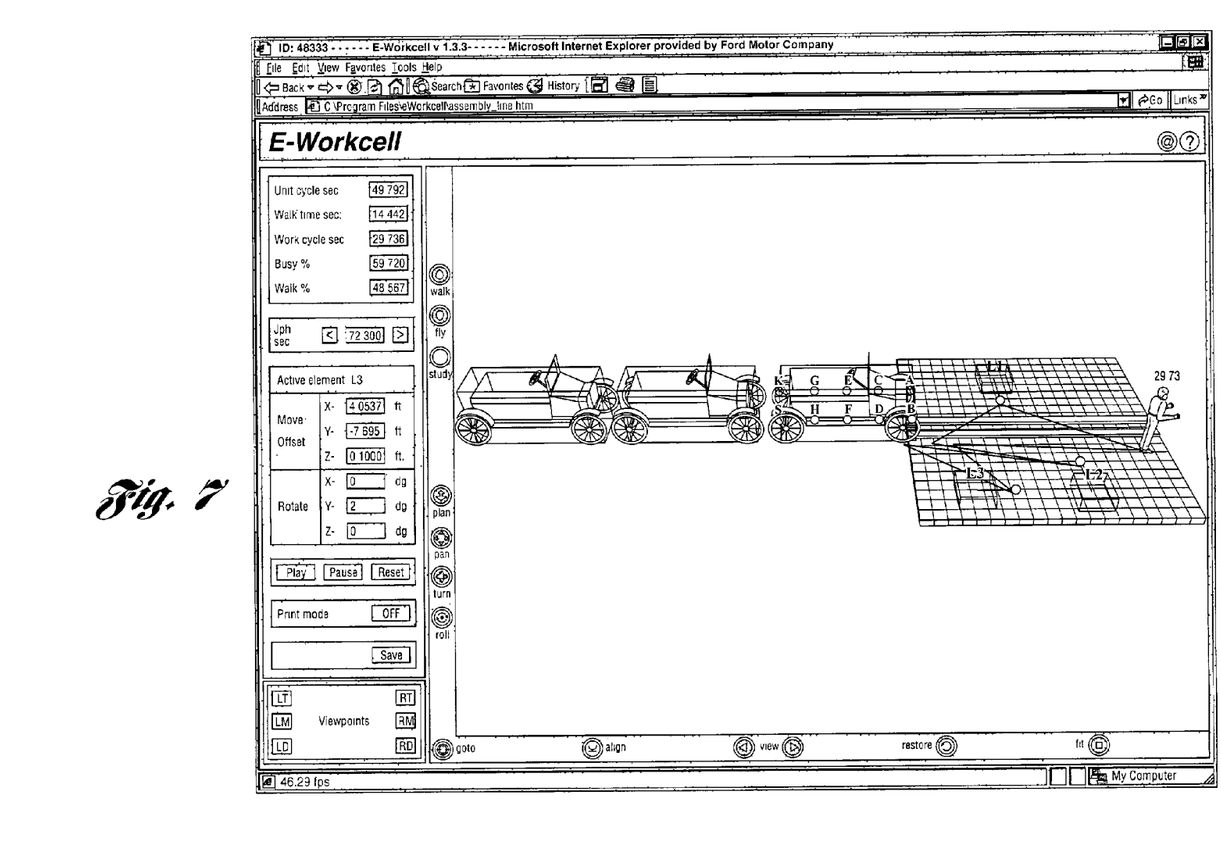
FIG. 7 illustrates an example VRML interface generated in accordance with the present invention.

As shown in FIG. 7, the example HTML page contains both a VRML and Java class, which may be linked through EAI. The Java applet shows some aggregate information on the critical parameters of the workcell, such as unit cycle time, operator cycle time, walk time, and line speed. These parameters dynamically change with the changes in workcell arrangement. The Java panel may additionally contain a set of control buttons for line speed adjustment, simulation, three-dimensional object manipulations, and communication of the results back to the database.

One of the main advantages of the proposed system is that it integrates a Web-based client server, a Virtual Reality interface, and mathematical models so that workcell arrangement can be designed, analyzed, simulated, documented, and maintained over corporate networks. This allows the workcell planning tool to efficiently interface with and complement other corporate systems involved in workcell studies.

For example, the present invention may be closely tied to a global study process allocation system, which maintains the information pertaining to the assembly process, including the sequence of steps for an operator with associated MODAPTS strings, the tools and parts required, and the position of the cell within the line. However, the process allocation system alone does not have the details on the geometry and locations of the specific workcell objects, and thus, can provide only average estimates for many operations, including operator walk time. Integrating the process allocation system with the present invention overcomes these problems.

Another example is the application of ROBCAD for detailed kinematics and ergonomics studies. ROBCAD allows development and comprehensive analysis of the detailed models of assembly operation. Problems associated with ROBCAD that may be addressed by the present invention include: (1) the development of a ROBCAD model of an assembly plant workcell is very time consuming, even for well-trained and experienced engineers; (2) the changes made to the workcell at the plant level quite often are not communicated to ROBCAD analysts, which in turn diminishes the accuracy of the study. With the proposed system, the ROBCAD model can be automatically generated from the database (by generating robface and path files), which contains accurate data (since it is maintained at the plant floor level).

In addition to the primary function, the tool may be used in several other creative ways. For example, the tool may give feedback to material control on whether or not proposed packages fit in the workcell. In another example, the tool may be used as a "visual" Quality Process Sheet (QPS) training aid. A QPS contains the breakdown of work into elements as specified by the operator. A plan view "snapshot" of the operator's workcell layout could also be pasted to the operations e-QPS sheet so that the workcell operation could be reviewed in various positions.

While the best mode for carrying out the invention has been described in detail, those familiar with the art to which this invention relates will recognize various alternative designs and embodiments for practicing the invention as defined by the following claims.

What is claimed:

1. A computer-implemented method for designing a workcell layout, the method comprising:
   receiving input defining one or more dimensions for a workcell;
   receiving input defining a size and location for one or more objects within the workcell;
   receiving input defining a walking velocity for an operator within the workcell;
   receiving input defining one or more tasks to be completed during a workcell cycle;
   receiving input defining one or more times and locations to complete the one or more tasks within the workcell;
   calculating a total walking time to complete the one or more tasks during the workcell cycle based upon the size and location of the object(s), the time(s) and location(s) to complete the task(s) and the operator walking velocity; and
   outputting the total walking time for the workcell cycle and a graphical representation of the workcell layout including the object(s) and an operator walking path between points within the workcell at which the one or more tasks are completed.

2. The method of claim 1 additionally comprising receiving input defining an assembly line velocity for a product being assembled wherein the total walking time calculation is additionally based upon the assembly line velocity.

3. The method of claim 1 additionally comprising receiving input to interactively define object locations.

4. The method of claim 1 wherein the graphical representation is coded with a virtual reality mark-up language.

5. The method of claim 1 wherein the graphical representation illustrates a workcell operator or an assembly line in motion.

6. The method of claim 1 additionally comprising interactively redefining object locations or walking paths to minimize the total walking time.

7. The method of claim 1 additionally comprising receiving input defining a work zone for a product within which the workcell operator is going to complete a task wherein the total walking time calculation is additionally based upon the location of the work zone.

8. The method of claim 1 additionally comprising calculating-and outputting a work cycle time based upon the location of the object(s), the time(s) to complete the task(s) and the operator walking velocity.

9. The method of claim 1 additionally comprising calculating and outputting an order that the tasks should be completed so as to reduce non-value-added time.

10. The method of claim 1 wherein the objects include parts, bins, tools, or supplies.

11. The method of claim 1 additionally comprising automatically generating a mathematically optimal workcell layout based upon at least one optimization routine.

12. The method of claim 1 wherein the tasks to be completed, the walking path and walking time are distributed among more than one operator.

13. A system for designing a workcell layout, the system comprising at least one computer configured to:
receive input defining one or more dimensions for a workcell;
receive input defining a size and location for one or more objects within the workcell;
receive input defining a walking velocity for an operator within the workcell;
receive input defining one or more t asks to be completed during a workcell cycle;
receive input defining one or more times and locations for completing the one or more tasks during the workcell cycle;
calculate a total walking time to complete the task(s) during the workcell cycle based upon the location of the object(s), the time(s) and location(s) for completing the task(s) and the walking velocity; and
output the total walking time for the workcell cycle and a graphical representation of the workcell layout including the object(s) and an operator walking path between points within the workcell at which the tasks are completed.

14. The system of claim 13 additionally configured to receive input defining an assembly line velocity for a product being assembled wherein the total walking time calculation is additionally based upon the assembly line velocity.

15. The system of claim 13 additionally configured to receive input to interactively define object locations.

16. The system of claim 13 wherein the graphical representation is coded with virtual reality markup language.

17. The system of claim 13 wherein the graphical representation illustrates a workcell operator or assembly line in motion.

18. The system of claim 13 additionally configured to receive input defining a work zone for a product within which the workcell operator performs a task wherein the total walking time calculation is additionally based upon the location of the work zone.

19. The system of claim 13 additionally configured to calculate and output an order that the tasks should be completed so as to reduce non-value-added time.

20. The system of claim 13 wherein the system is additionally configured to automatically generate a mathematically optimal workcell layout based upon at least one optimization routine.

21. The system of claim 13 additionally configured to calculate and output a work cycle time based upon the location of the object(s), the time(s) to complete the task(s) and the operator walking velocity.

22. A computer-implemented system for representing a workcell layout, the system comprising:
a computer configured to receive input defining one or more dimensions for a workcell, a size and location for one or more objects within the workcell, one or more tasks to be completed during a workcell cycle, a time and location for completing the one or more tasks during the workcell cycle, and a walking velocity for a workcell operator;
a means for calculating a total walking time to complete the one or more tasks during the workcell cycle; and
a means for outputting the total walking time for the workcell cycle and a graphical representation of the workcell layout including the object(s) and an operator walking path between points within the workcell at which the tasks are completed.

* * * * *